United States Patent
Weiland et al.

(10) Patent No.: US 7,850,460 B2
(45) Date of Patent: Dec. 14, 2010

(54) ELECTRICAL CONTACT ELEMENT FOR CONTACTING AN ELECTRICAL COMPONENT UNDER TEST AND CONTACTING APPARATUS

(75) Inventors: Achim Weiland, Hildrizhausen (DE); Gunther Boehm, Nufringen (DE)

(73) Assignee: Feinmetall GmbH (DE)

( * ) Notice: Subject to any disclaimer, the term of this patent is extended or adjusted under 35 U.S.C. 154(b) by 0 days.

(21) Appl. No.: 12/463,083

(22) Filed: May 8, 2009

(65) Prior Publication Data

US 2009/0280676 A1 Nov. 12, 2009

(30) Foreign Application Priority Data

May 9, 2008 (DE) .................. 10 2008 023 761

(51) Int. Cl.
*H01R 12/00* (2006.01)
(52) U.S. Cl. ......................................................... 439/66
(58) Field of Classification Search .................. 439/66, 439/67, 68, 700, 482; 324/761
See application file for complete search history.

(56) References Cited

U.S. PATENT DOCUMENTS

| 4,026,011 | A | * | 5/1977 | Walton ........................ 29/846 |
| 4,027,935 | A | * | 6/1977 | Byrnes et al. ................ 439/289 |
| 4,076,356 | A | * | 2/1978 | Tamburro .................... 439/426 |
| 4,116,523 | A | * | 9/1978 | Coberly et al. .............. 439/578 |
| 4,737,114 | A | | 4/1988 | Yaegashi |
| 4,773,877 | A | * | 9/1988 | Kruger et al. ................ 439/482 |
| 5,225,777 | A | * | 7/1993 | Bross et al. .................. 324/754 |
| 5,399,982 | A | * | 3/1995 | Driller et al. ................ 324/754 |
| 5,865,641 | A | * | 2/1999 | Swart et al. .................. 439/482 |
| 5,917,707 | A | * | 6/1999 | Khandros et al. ............ 361/776 |
| 5,952,843 | A | * | 9/1999 | Vinh ........................... 324/761 |
| 6,024,579 | A | * | 2/2000 | Bennett ........................ 439/66 |
| 6,358,097 | B1 | * | 3/2002 | Peters ........................ 439/700 |
| 6,471,524 | B1 | * | 10/2002 | Nakano et al. ................ 439/70 |
| 6,491,968 | B1 | * | 12/2002 | Mathieu et al. ............... 29/842 |
| 6,515,496 | B2 | * | 2/2003 | Felici et al. .................. 324/754 |
| 6,758,682 | B1 | * | 7/2004 | Kosmala ...................... 439/66 |
| 6,855,010 | B1 | * | 2/2005 | Yen ............................. 439/700 |
| 6,859,054 | B1 | * | 2/2005 | Zhou et al. .................. 324/754 |
| D507,198 | S | * | 7/2005 | Kister ......................... D10/78 |
| 6,945,827 | B2 | | 9/2005 | Grube et al. |
| 7,690,925 | B2 | * | 4/2010 | Goodman .................... 439/70 |
| 2002/0113612 | A1 | * | 8/2002 | Nguyen ....................... 324/761 |
| 2002/0142669 | A1 | * | 10/2002 | Phillips ...................... 439/700 |
| 2004/0121627 | A1 | * | 6/2004 | Grube et al. .................. 439/66 |
| 2005/0064765 | A1 | * | 3/2005 | Simpson et al. ............. 439/700 |

(Continued)

FOREIGN PATENT DOCUMENTS

CH 661129 A5 6/1987

(Continued)

*Primary Examiner*—Neil Abrams
*Assistant Examiner*—Harshad C Patel
(74) *Attorney, Agent, or Firm*—Ostrolenk Faber LLP (57) ABSTRACT

An elongate electrical contact element (1) for physically contacting electrical components under test, having two electrical contacting end regions (2, 3) and an elongate intermediate region (4) situated between the end regions (2, 3). The intermediate region (4) has an essentially rectangular cross-section and is configured lamellar along its longitudinal extent. Also disclosed is a corresponding contacting apparatus (22) including such a contact element (1) and a contact element holder (23).

33 Claims, 4 Drawing Sheets

U.S. PATENT DOCUMENTS

| | | | |
|---|---|---|---|
| 2005/0070170 A1* | 3/2005 | Zhang et al. | 439/700 |
| 2006/0046528 A1* | 3/2006 | Beaman et al. | 439/66 |
| 2006/0073712 A1 | 4/2006 | Suhir | |
| 2006/0170440 A1 | 8/2006 | Sudin | |
| 2008/0001612 A1 | 1/2008 | Kister | |

FOREIGN PATENT DOCUMENTS

| | | |
|---|---|---|
| DE | 4104215 A1 | 8/1992 |
| GB | 1470007 | 4/1977 |
| WO | 2007/097559 A1 | 8/2007 |

* cited by examiner

Fig. 4 ent. This configuration provides a large cross-section determined by the number of lamellae, so that even large test currents can be transferred without overheating. The lamellar structure also ensures a contact force which is sufficiently small, but adequate for good contacting, since, due to the lamellae, good elasticity is achieved with the electrically conductive material used. With the elongate contact elements according to the invention, "vertical contacting" is achieved, which means that a contact element is provided which is oriented approximately perpendicularly to the contact plane, which, on contacting is able to buckle laterally. The rectangular cross-section permits a very compact pattern for a contact element arrangement together with a high current-carrying capacity, while the lamellar intermediate region enables easy buckling, which nevertheless provides an adequate contact force. The form of the contact element according to the invention enables the contacting of components under test, in particular wafers with a mean contact separation of 40 μm and less. The rectangular cross-section of the intermediate region means that the outer cross-section contour has this form, which means that the structure of internally positioned lamellae is not taken into account. Where a rectangular cross-section is mentioned in this application, regardless of which part of the contact element this cross-section belongs to, a square cross-section is always included.

ELECTRICAL CONTACT ELEMENT FOR CONTACTING AN ELECTRICAL COMPONENT UNDER TEST AND CONTACTING APPARATUS

The following disclosure is based on German Patent Application No. 10 2008 023 761.2, filed on May 9, 2008, which is incorporated into this application by reference.

FIELD OF AND BACKGROUND OF THE INVENTION

The invention relates to an elongate electrical contact element for physically contacting an electrical component under test, comprising two electrical contacting end regions and an elongate intermediate region situated between the end regions.

Contact elements of this type are known in the form of spring contact probes or buckling beams. They are held by a contact element holder and serve to contact the electrical component under test with one end region and, with the other end region, to make contact with an electrical test apparatus, so that test current paths are created to the electrical component under test and the test apparatus can test the component under test for fault-free electrical function. The known contact elements configured as spring contact probes or buckling beams have circular cross-sections and produce contact forces when placed on contact surfaces of the component under test. In the case of a spring contact probe, its contact force is determined by a plunger which is impinged upon by a helical spring. In the case of a buckling beam, the contact force results from the intrinsic elasticity of the probe material. The buckling beam is deflected laterally into an arc shape by the contacting procedure and returns to the starting position following the contacting procedure. Due to components under test becoming ever more compact and the associated decreasing electrical contact separations, increasingly, problems arise with the aforementioned known contact elements. In other words, the small contact separations cannot be achieved with conventional technology, or they lead to contact elements unintentionally touching and creating short circuits. Furthermore, reductions in cross-section of spring contact probes or buckling beams that are necessary for space reasons lead to a reduced current carrying capacity together with reduced contact force. The smaller cross-sections can result in burning through if the test currents are required to be at a particular level. This burn-out mostly occurs at a distance from the guide apertures in which, for example, the buckling beams are guided. This is because the mechanical contact of the buckling beams with the walls of the guide apertures leads, in the immediate vicinity thereof, to conducting away of heat, which however is not the case further away from the guide region.

OBJECTS AND SUMMARY OF THE INVENTION

It is therefore an object of the invention to provide an electrical contact element of the aforementioned type which, given a smaller but adequate contact force, provides a large cross-section and thus a large current-carrying capacity. It is a further object to provide an electrical contact element that is usable, in particular, with very small contact distances.

These objects are achieved, according to one formulation of the invention, in that the intermediate region of the electrical contact element has an at least substantially rectangular cross-section and is configured lamellar along its longitudinal In one embodiment of the invention, it is provided that the lamellar intermediate region comprises at least two lamellae extending in the longitudinal direction of the intermediate region. Preferably, more than two lamellae are provided, extending in the longitudinal direction of the elongate contact element. In particular, the lamellae extend essentially parallel to one another, regardless of whether they have a straight or a curved course.

Preferably, adjacent lamellae have at least one longitudinal slot between them, which means that they are separated or spaced apart from one another by said at least one longitudinal slot. If, during contacting of a component under test, bending, that is, buckling of the contact element takes place, it is conceivable that adjacent lamellae could touch one another at least partially due to a reduction in the distance formed by the longitudinal slot, so that there is no longer any distance, but still a separation, between them.

Another embodiment of the invention provides that the contact element has a one-piece contact body. Accordingly, the two end regions and the intermediate region comprising the lamellae are configured in one piece.

Alternatively, it is also possible that the contact element has a multi-component contact body, with a contact insert in the region of at least one contacting zone. The contact insert provides for electrical contact and can be made, for example, from material with particularly good electrical conducting properties, while a different material is used for the remainder of the contact body region.

In particular, it is provided that the contact element has a length L, a width B and a thickness D. The arrangement is preferably structured such that the length L of the contact element is greater than its width B. It can preferably be provided that the width B of the contact element is greater than its thickness D. Preferably, the contact element is therefore constructed essentially strip shaped, specifically as a contact strip.

Another embodiment of the invention provides that the lamellae each have a length l, a width b and a depth t. The length l of a lamella is preferably greater than the width b thereof. In particular, it can also be provided that the width b of a lamella is greater than its depth t.

It was mentioned above that the cross-section of the intermediate region is essentially rectangular. It can be provided, in particular, that the whole contact element has an essentially rectangular cross-section, so that the two end regions are also constructed with a rectangular cross-section, although it is not necessary for the rectangular cross-sections of one end region, the intermediate region, and the other end region to be of equal size or to have the same form.

Particularly preferably, it is provided that the cross-section of at least one of the lamellae is configured essentially rectangular. All the lamellae preferably have a rectangular cross-section.

The arrangement can be designed so that the thickness D of the contact element corresponds to the width b of at least one of the lamellae, and preferably the width b of all the lamellae, so that the width b of the lamella or lamellae is determined by the thickness D of the contact element.

The contact element preferably consists of an elastic material. This enables the bending (buckling) to be achieved particularly well during contacting. It is also always ensured that the contact element returns to its original form after contacting, that is, in its unloaded condition.

According to one embodiment of the invention, it is preferably provided that, in their relaxed, non-contacting condition and/or in their tensioned, contacting form, the lamellae have an arched form comprising at least one arc. As a consequence, the contact element can be "pre-bent" so that the lamellae have an arched form in the unloaded state, which becomes more strongly arched when making contact. Alternatively, it can also be provided that no pre-bending exists, but that the lamellae bend on loading and only then assume an arched form.

Particularly preferably, it is provided that the at least one arc of the arched form lies in a plane defined by the length L and the width B of the contact element. This has the advantage that all the lamellae bend or are bent similarly, that is, in the same direction. This applies also to adjacent contact elements, so that mutual contacting of adjacent contact elements and consequent electrical short-circuit is prevented. According to the above definition, the individual lamellae are bent about their smallest dimension, that is, their depth t, which means that the whole intermediate region is bent about its width B, which is configured greater than the thickness D of the contact element.

According to another embodiment of the invention, it can be provided that the cross-sectional area and/or cross-sectional form of a lamella varies over its longitudinal extent. In addition, or alternatively, it is also possible that the cross-sectional areas and/or cross-sectional forms of the individual lamellae are different from one another.

According to another embodiment of the invention, it is provided that one end region, particularly on the component-under-test side, has a first contacting zone which is off-center relative to the width B of the contact element. In particular, the whole of an end region, or a large portion thereof, can lie off-center relative to the width B of the contact element. This off-center position initiates buckling in a defined direction, so that the buckling direction is thereby pre-determined.

The other end region can—according to a further exemplary embodiment—have a second contacting zone which is centrally placed. This involves, in particular, the end region facing away from the component under test.

It is advantageous if the first and/or second contacting zone has or each have a contact tip which tapers from two sides. This leads, particularly during contacting, to a linear contact or to an essentially rectangular contact surface.

According to a further development of the invention, it is provided that the contact element has two longitudinal sides of which one has an elbowed contour, to produce a lateral offset of one end region. This results, in particular, in the above described off-center position of the first contacting zone.

The elbowed contour of one longitudinal side results, in particular, in a retaining step. This serves to hold the contact element in a contact element holder so that it cannot slide out therefrom.

The contact element preferably comprises one section that is provided with an electrically insulating coating and/or a contacting coating. The contacting coating can be brought into material engagement with the contact element, for example, by melting on.

It is also advantageous if at least one of the end regions has a curvature and/or an inclination which is directed opposed to the arc of the arched form. As a result, when the contact element is placed on the component under test, during the elastic bending in the longitudinal extent of the contact element in the course of the contacting, said end region performs a tilting motion which, in relation to the contacting site, manifests itself as a scratching motion, so that a particularly good electrical contact can be achieved, even if the contact surfaces are soiled and/or have oxide layers.

It is also advantageous if at least one of the end regions, in particular, the off-center end region, has an essentially rectangular cross-section. This cross-section preferably cooperates with a guide hole/guide aperture which also has a rectangular cross-section. This will be considered in greater detail below.

The invention also relates to an electrical contacting apparatus having at least one contact element, as described above, and a contact element holder having at least two guides for the contact element arranged at a distance from one another, of which one has at least one guide aperture which is penetrated by the contact element. The two guides can be configured, in particular, as guide plates wherein the contact element is held by the guides at both its end regions in that both, or at least one, end region penetrates a corresponding guide aperture.

As mentioned above, it is preferably provided that at least one of the guide apertures has an essentially rectangular cross-section. The arrangement is designed such that the rectangular end region lies in the rectangular guide aperture with only very little play, so that it is possible to insert the contact element in the guide aperture and also that movement is possible when contacting and when breaking the contacting.

The guide aperture having a rectangular cross-section preferably has four guide aperture walls of which a first guide aperture wall lies opposing a second guide aperture wall.

It is provided, in particular, that in the relaxed, non-contacting condition, the contact element is held in the guide aperture such that one of the longitudinal sides of the contact element lies against a first site of the first guide aperture wall and the other longitudinal side of the contact element lies against a second site of the second guide aperture wall, wherein the two sites are spaced apart from one another axially. The word "axially" should be understood as relating to the longitudinal extent of the contact element. When a component under test is contacted with the contact element, said contact element is tensioned and is consequently brought into the contacting condition, and is guided in the guide aperture such that the longitudinal side which, in the relaxed condition, previously lay against the first site of the first guide aperture wall now lies against a third site of the first guide aperture wall and that the longitudinal side of the contact element which previously lay against the second site of the second guide aperture wall now lies against a fourth site of the second guide aperture wall. From this, it is clear that during contacting, a tilting motion of the contact element takes place in the region of the guide aperture, with the result that the aforementioned scratching motion takes place, so that the contacting zone scratches along a contact surface of the component under test and thereby creates a very low resistance electrical connection path. In the relaxed, non-contacting condition the contact element assumes a defined position due to the aforementioned lying against the guide aperture walls and in the tensioned, contacting condition, a defined end position is again assumed, so that the tilting motion which occurs is reproducibly restricted. With regard to the contacting process, this tilting motion involves an "edge change" in that the contacting zone serving to provide the electrical contact tilts about the contact edge, which leads to particularly good contacting results. It is noteworthy that, due to the very small dimensions of the components involved and due to the extremely small contact separations in the component under test, the scratching motion is only microscopically small, although this is entirely adequate for a good electrical result.

BRIEF DESCRIPTION OF THE DRAWINGS

The invention will now be described in greater detail by reference to an exemplary embodiment. In the drawings.

DETAILED DESCRIPTION OF AN EXEMPLARY EMBODIMENT

Figure 1:
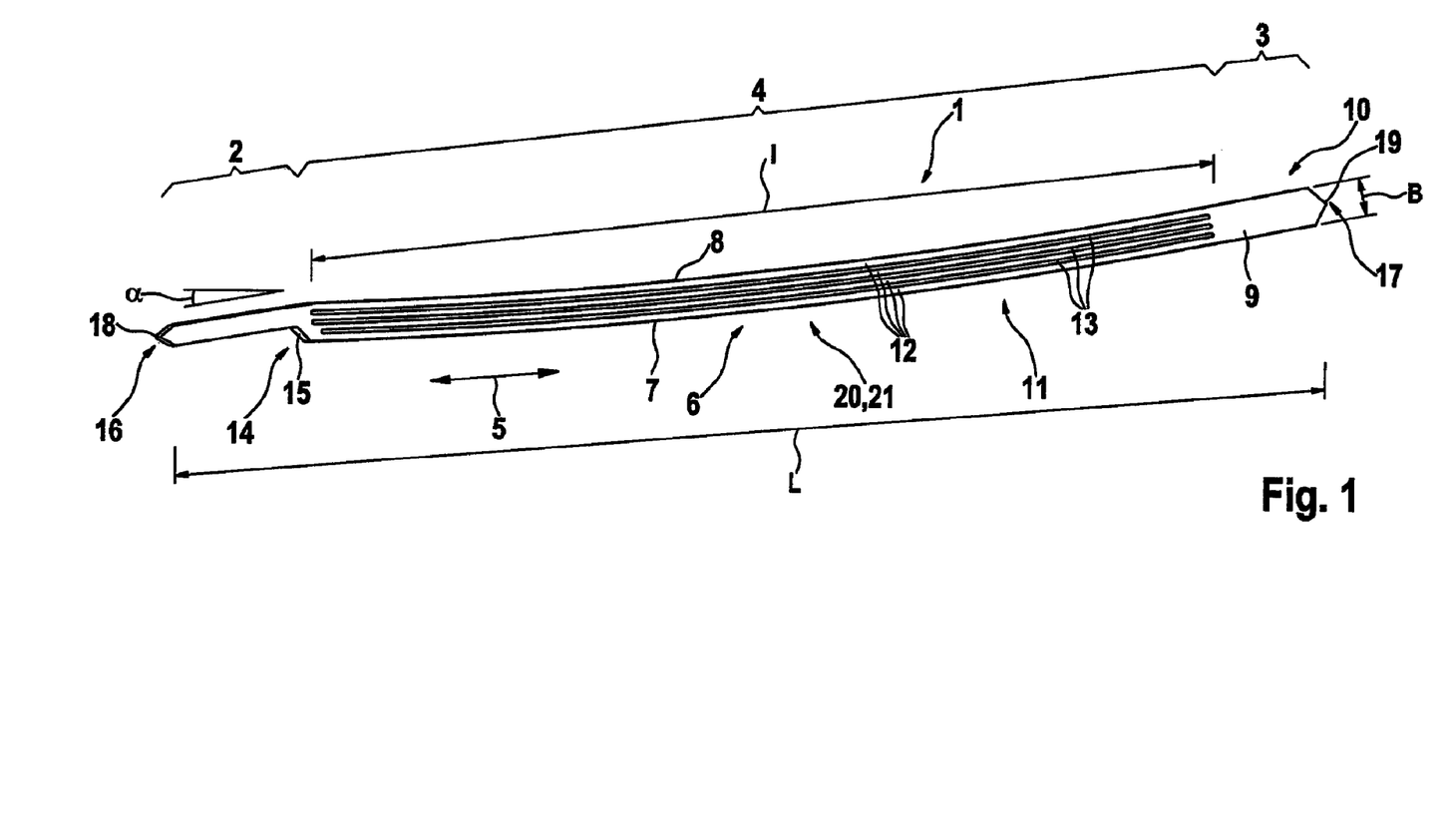
FIG. 1 shows a plan view of a contact element.

FIG. 1 shows an elongate electrical contact element 1, which serves to make contact with electrical components under test. The contact element 1 has two end regions 2 and 3 and an elongate intermediate region 4 lying therebetween. The two end regions 2 and 3 are also configured elongate. Therefore, overall the contact element has a longitudinal extent that is indicated with a double-headed arrow 5.

Figure 2:
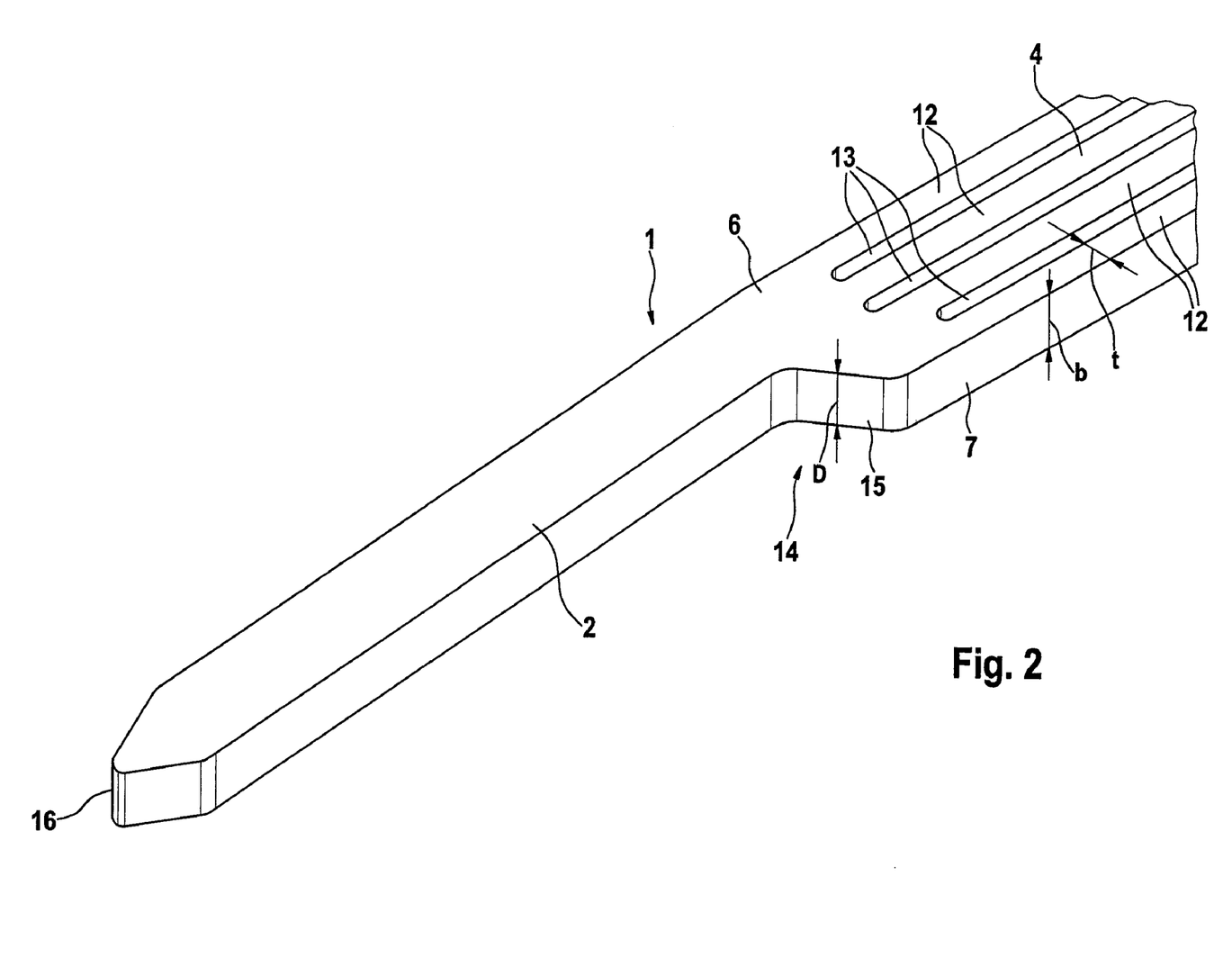
FIG. 2 shows an end region of the contact element of FIG. 1 which can be applied to a component under test.

The contact element 1 is configured in one piece. It comprises a single-piece contact body 6. The contact element 1 has two longitudinal sides 7, 8, a front side 9 and a rear side 10 opposing the front side. It has a length L, a width B and a thickness D (FIG. 2). Due to its elongate form, the contact element 1 is essentially configured as a contact strip 11. This circumstance results, in particular, therefrom that the length L is configured greater than the width B and said width B is greater than the thickness D.

As shown in the drawings, the intermediate region 4 is configured lamellar, which means that it has lamellae 12 which extend in the longitudinal direction (double-headed arrow 5). The lamellae 12 preferably run mutually parallel (despite the fact that they have an arched form, which will be considered in greater detail below). Adjacent lamellae 12 are each separated from one another by a longitudinal slot 13. The arrangement is preferably designed such that the lamellae 12 have a length l (FIG. 1), a width b and a depth t. The length l is greater than the width b. The width b is greater than the depth t (FIG. 2). It is also clear from FIG. 2 that the width b of the lamellae 12 is the same as the thickness D of the contact element. In other embodiments (not shown), it can be provided that the width b of the lamellae 12, or of one or more of the lamellae 12, is greater or smaller than the thickness D of the contact element 1. The width b of the lamellae 12 can be in the range of 10 μm to 100 μm, for instance 30 μm, and the depth t can be in the range of 10 μm to 50 μm, for instance 20 μm. In the exemplary embodiment shown, the contact element 1 comprises four lamellae 12 between which are arranged three longitudinal slots 13. It is also possible to provide a different number of lamellae 12. The smallest number of lamellae is two.

The longitudinal side 7 of the contact element 1 has an elbowed contour, which leads to a lateral offset of the end region 2. The elbow is identified in FIG. 1 with the reference sign 14. Due to the elbow 14, the end region 2 extends off-center, which means that the end region 2 lies laterally offset relative to the center of the length of the front side 9. The offset results in the formation of a retaining step 15. The end region 2 comprises a first contacting zone 16 and the end region 3 comprises a second contacting zone 17.

The first and second contacting zones 16, 17 each consist of contact tips 18, 19. The longitudinal ridges of the contact tips 18, 19 extend in the direction of the thickness D of the contact element 1. Due to the elbow 14, the end region 2 lies largely off-center and the second contact zone 17 lies centrally in relation to the width B of the contact element 1.

The whole contact element 1 has a rectangular cross-section. This applies both to the end region 2, to the end region 3, and to the intermediate region 4 (seen as an overall contour) as well as to the individual lamellae 12. Alternatively, other cross-sectional forms, such as circular forms, are also possible.

It is clear from FIG. 1 that the contact element 1 in the unloaded condition shown there does not extend straight, but rather that it has an arc 20 and therefore possesses an arched form 21. The individual lamellae 12 therefore extend in an arc. It is also recognizable that the end region 2 has an inclination, indicated by the angle α drawn in on FIG. 1 which is directed opposed to the arc 20. This means that the first contact zone 16 lies approximately centrally to the width B, although the connection of the end region 2 to the intermediate region 4 lies—as stated—off-center.

The contact element 1 comprises an elastic, electrically conductive material.

Figure 3:
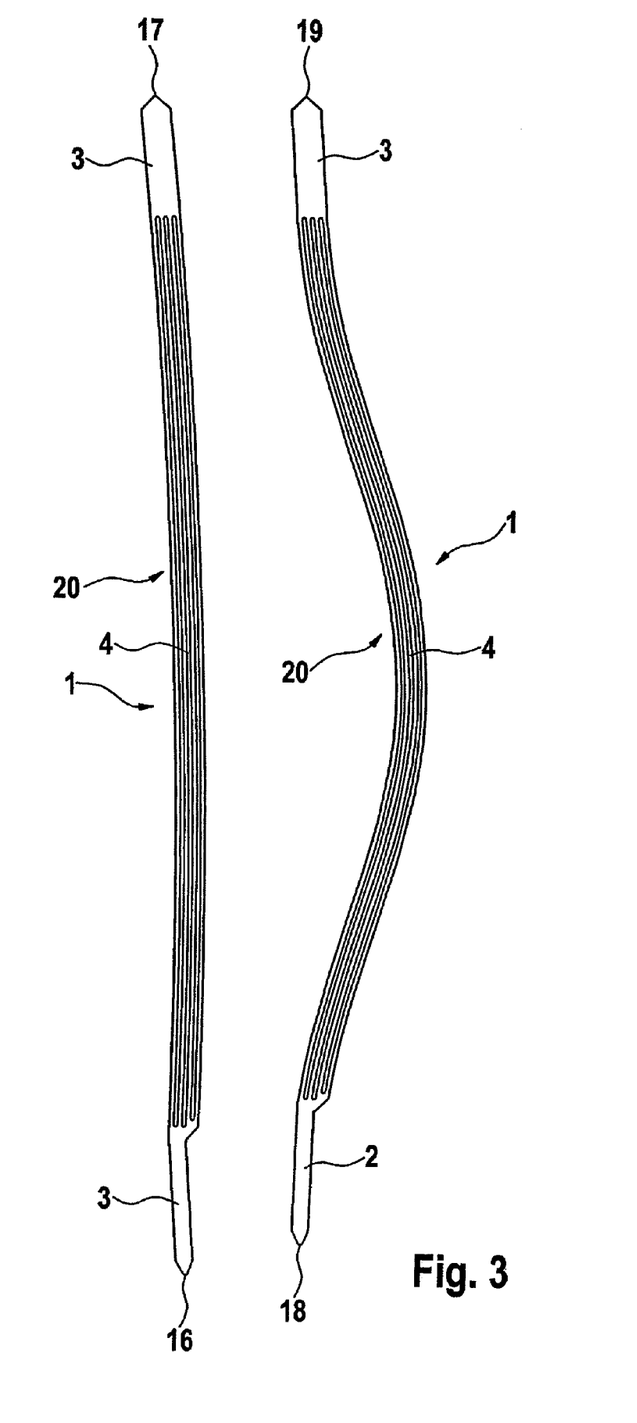
FIG. 3 shows the contact element of FIG. 1 in the relaxed, non-contacting state and in the tensioned, contacting state.

It is clear from FIG. 3 that the contact element 1 bends more severely under load, so that the prior bend in the unloaded state (at left in FIG. 3) is increased under load (at right in FIG. 3), that is, on contacting an electrical component under test (not shown). The individual lamellae 12 are bent in a plane which lies parallel to the front side 9 and/or the rear side 10 of the contact element 1.

Figure 4:
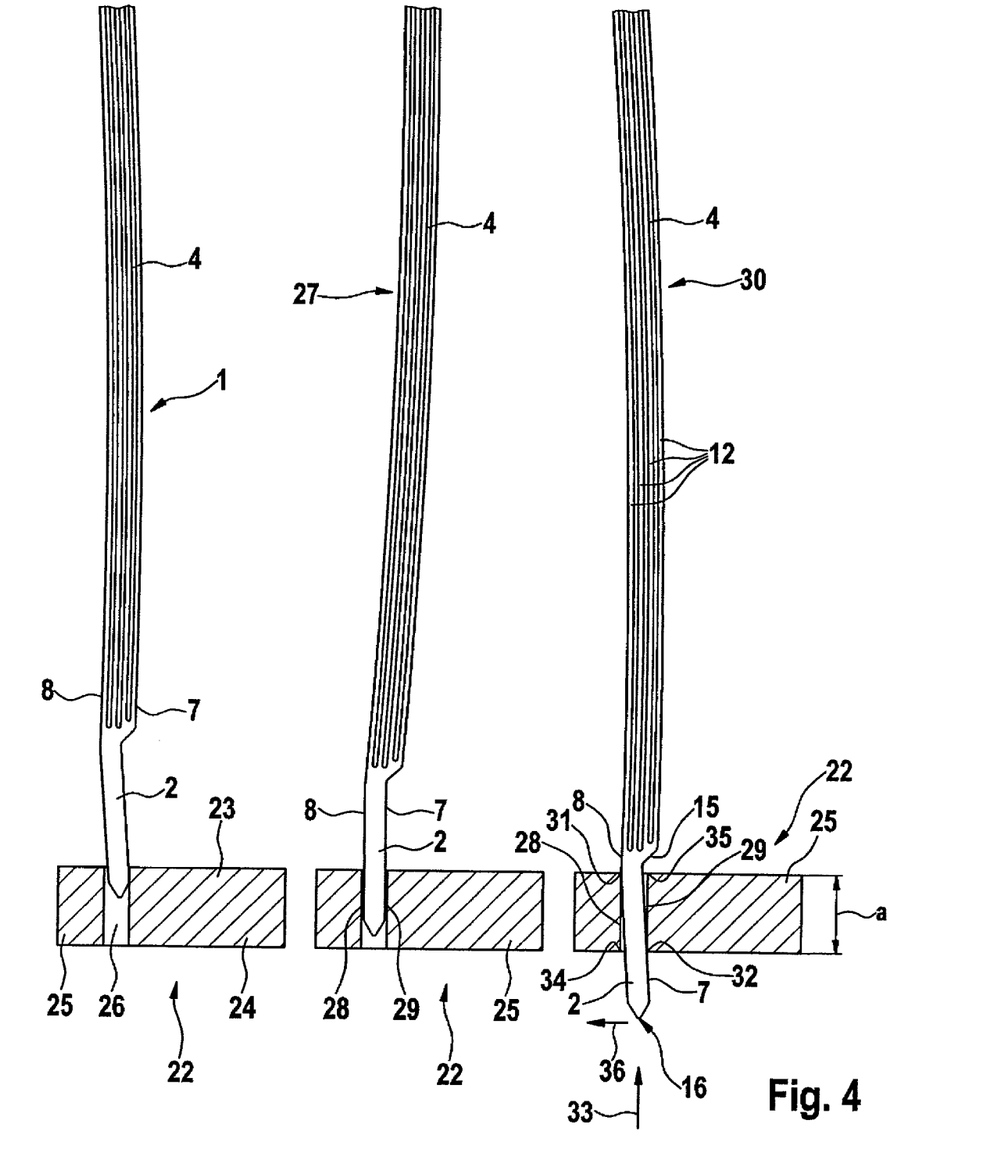
FIG. 4 shows the process of inserting a contact element into a contacting apparatus in three steps.

FIG. 4 illustrates a contacting apparatus 22 which comprises at least one contact element 1 and a contact element holder 23. In FIG. 4, the same assembly is shown three times consecutively in order to illustrate a process of inserting the contact element 1 into the contact element holder 23. It is clear that the contact element holder 23 comprises a guide 24 in the form of a guide plate 25. The guide 24 comprises a guide aperture 26 which has a rectangular cross-section, wherein this rectangular cross-section is essentially adapted to the rectangular cross-section of the end region 2 of the contact element 1, so that only a small degree of play exists when the end region 2 is situated in the guide aperture 26. It can be provided, in particular—although this is not illustrated in FIG. 4—that the other end region 3 is also guided in a guide 24.

The individual illustrations of FIG. 4 illustrate the insertion of a contact element 1 into the contact element holder 23, wherein the contact element is held at its end region 3 (not shown). The insertion takes place in that initially the front tip region of the end region 2 is inserted a little into the guide aperture 26. Since the end region 23 has an inclination (angle α), it is necessary to bend the contact element 1 further in relation to the relaxed form, as indicated by the arrow 27 (central illustration in FIG. 4), so that the longitudinal sides 7 and 8 of the end region 2 extend parallel to the first and second guide aperture walls 28 and 29 of the guide aperture 26. The end region 2 is now pushed into the guide aperture 26 far enough such that the contact zone 16—as per the right illustration in FIG. 4—extends a good way out of the guide 24 downwardly. The contact element 1 then relaxes a little so that the arc reduces (arrow 30), such that a slight pre-tension is exerted on the guide aperture 26. A contact element 1 mounted in this manner therefore lies in the guide aperture 26—as per the right illustration of FIG. 4—such that the longitudinal side 8 lies against a site 31 of the first guide aperture wall 28 and the other longitudinal side 7 of the contact element 1 lies against a site 32 of the second guide aperture wall 29, wherein the two sites 31, 32 have an axial spacing a from one another.

If, for contacting, the contacting zone 16 is pressed (pressing force 33) for physical contact against an electrical component under test (not shown), the lamellae 12 bend or bend more strongly, with the consequence that the end region 2 tilts in the guide aperture 26 such that, in this tensioned, contacting condition, the end region 2 of the contact element 1 is held in the guide aperture 26 such that the longitudinal side 8 which previously lay, in the relaxed state (right illustration of FIG. 4), against the site 31 of the first guide aperture wall 28, now lies against another site 34 of the first guide aperture wall 28 and that the longitudinal side 7 which previously lay against the second guide aperture wall 29 at the site 32, now also lies against another site 35 of the second guide aperture wall 29. The two sites 34 and 35 also have an axial spacing a from one another. A change of edges effectively takes place. It is apparent that, due to this change of edges, the first contacting zone 16 is displaced in the direction of the arrow 36, with the consequence that a scratching motion takes place on the contact site of the electrical component under test (not shown). This has the result that dirt can be cleared away on contacting and possible oxidation sites removed, so that a very good electrical contact is achieved.

According to the invention, a contact element 1 is provided which comprises a plurality of arranged strips of rectangular cross-section, the lamellae 12. The lamellae 12 are connected to one another in such a manner that a resultant buckling motion of the contact element 1 corresponds to that of the individual lamellae 12. In order to favor buckling during contacting, the contact element is configured slightly pre-bent. Through a correspondingly non-central force application, particularly due to the offset of the end region 2 relative to the center in relation to the width B of the contact element and the aforementioned slight prior bend, a marked buckling behavior of the contact element 1 is pre-determined. Since the contact element 1 narrows in the end region 2, a retaining effect is produced in the guide 24, due to the retaining step 15. The inclination of the end region 2 which is contrary to the curvature (arc 20) is responsible for the following effects: defined contact of the edges (as per FIG. 4), resulting in positional accuracy; slight clamping in the guide 24 and consequently securing against falling out upwardly (rearwardly); during buckling (contacting), an edge change takes place and the tip (contacting zone 16) performs a "scrub"; on assembly, the contact element 1 is slightly buckled and the end region 2 thereby orients itself parallel to the guide aperture 26—this facilitates feeding in.

The lamellae 12 permit a large cross-section and so ensure a low electrical resistance. At the same time, a flat design with low contact force is provided. It is possible for contacting of very closely arranged contacts on a component under test to be performed, for example, at least a 40 μm pitch. The overall length L can be, for example, 3.5 mm. The contact force is approximately 27 mN. The electrical resistance is approximately 0.3 Ohm.

The above description has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An elongate electrical contact element for physically contacting an electrical component under test, said element comprising two electrical contacting end regions and an elongate intermediate region situated between the end regions, having an at least substantially rectangular cross-section, and configured lamellar along a longitudinal extent of the intermediate region, wherein the lamellar intermediate region comprises at least two lamellae extending in the longitudinal extent of the intermediate region, adjacent ones of the lamellae being separated from one another by at least one longitudinal slot, the lamellae being configured to bend if a contacting zone of the contact element is pressed against the electrical component under test.

2. The contact element of claim 1, wherein said contact element is a one-piece contact body.

3. The contact element of claim 1, said contact element is fashioned of plural components and comprises a contact insert in a contacting zone of at least one of the end regions.

4. The contact element of claim 1, wherein said contact element has a length L, a width B and a thickness D.

5. The contact element of claim 4, wherein the length L is greater than the width B.

6. The contact element of claim 4, wherein the width B is greater than the thickness D.

7. The contact element of claim 1, wherein said contact element is configured at least substantially as a contact strip.

8. The contact element of claim 1, wherein the lamellae each have a length l, a width b and a depth t.

9. The contact element of claim 8, wherein the length l is greater than the width b.

10. The contact element of claim 8, wherein the width b is greater than the depth t.

11. The contact element of claim 1, wherein said contact element is at least substantially rectangular in cross-section.

12. The contact element of claim 1, wherein at least one of the lamellae has an at least substantially rectangular cross-section.

13. The contact element of claim 1, wherein a thickness D of said contact element coextends with a width b of at least one of the lamellae.

14. The contact element of claim 1, wherein said contact element is made from an elastic material.

15. The contact element of claim 1, wherein the lamellae have an arched form comprising at least one arc in at least one of a relaxed, non-contacting condition and in a tensioned, contacting condition of said contact element.

16. The contact element of claim 15, wherein the lamellae differ in at least one of respective length and arched form.

17. The contact element of claim 1, wherein the at least one arc of the arched form lies in a plane defined by a length L of the contact element and a width B of the contact element.

18. The contact element of claim 1, wherein at least one of the lamellae differs in at least one of cross-sectional area and cross-sectional form along the longitudinal extent.

19. The contact element of claim 1, wherein the lamellae differ in at least one of respective cross-sectional area and respective cross-sectional form.

20. The contact element of claim 1, wherein at least one of the end regions comprises a first contacting zone disposed off-center relative to a width B of the contact element.

21. The contact element of claim 20, wherein another of the end regions comprises a second contacting zone disposed centrally relative to the width B of the contact element.

22. The contact element of claim 1, wherein at least one of the end regions comprises a contacting zone having a contact tip that tapers from two sides.

23. The contact element of claim 1, wherein said contact element comprises two longitudinal sides, of which one side has an elbowed contour, thereby forming a lateral offset of one of the end regions.

24. The contact element of claim 23, wherein the elbowed contour of the one longitudinal side forms a retaining step.

25. The contact element of claim 1, wherein at least one section of said contact element is provided with at least one of an electrically insulating coating and a contacting coating.

26. The contact element of claim 1, wherein at least one of the end regions has a curvature or an incline which is directed opposed to the arc of the arched form.

27. The contact element of claim 1, wherein at least one of the end regions has an at least substantially rectangular cross-section.

28. An electrical contacting apparatus comprising at least one contact element as claimed in claim 1 and further comprising a contact element holder which comprises at least two guides arranged spaced apart from one another for the contact element, of which guides at least one comprises at least one guide aperture dimensioned to be penetrated by the contact element.

29. The contacting apparatus of claim 28, wherein the at least one guide aperture has an at least substantially rectangular cross-section.

30. The contacting apparatus of claim 28, wherein the guide aperture having the rectangular cross-section comprises four guide aperture walls of which a first guide aperture wall lies opposing a second guide aperture wall.

31. The contacting apparatus of claim 30, wherein, in a relaxed, non-contacting condition, the contact element is held in the guide aperture such that one longitudinal side of the contact element lies against a first site of the first guide aperture wall and the other of the longitudinal sides of the contact element lies against a first site of the second guide aperture wall, wherein the respective first sites of the first and the second guide aperture walls are spaced apart from one another axially.

32. The contacting apparatus of claim 31, wherein, in a tensioned, contacting condition, the contact element is held in the guide aperture such that the one longitudinal side lies against a second site of the first guide aperture wall offset from the first site of the first guide aperture wall, and the other longitudinal side of the contact element lies against a second site of the second guide aperture wall offset from the first site of the second guide aperture wall.

33. An elongate electrical contact element for physically contacting an electrical component under test, said element comprising two electrical contacting end regions and an elongate intermediate region situated between the end regions, having an at least substantially rectangular cross-section, and configured lamellar along a longitudinal extent of the intermediate region, wherein the lamellar intermediate region comprises at least two lamellae extending in the longitudinal extent of the intermediate region, adjacent ones of the lamellae being separated from one another by at least one longitudinal slot, the lamellae having an arched form comprising at least one arc in at least one of a relaxed, non-contacting condition and in a tensioned, contacting condition of the contact element.

* * * * *